US011621178B2

(12) United States Patent
Aoyama et al.

(10) Patent No.: US 11,621,178 B2
(45) Date of Patent: Apr. 4, 2023

(54) LIGHT IRRADIATION TYPE HEAT TREATMENT APPARATUS INCLUDING OXYGEN ANALYZER AND HEAT TREATMENT METHOD THEREOF

(71) Applicant: SCREEN HOLDINGS CO., LTD., Kyoto (JP)

(72) Inventors: Takayuki Aoyama, Kyoto (JP); Akitsugu Ueda, Kyoto (JP); Mao Omori, Kyoto (JP); Kazunori Amago, Shiga (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 1062 days.

(21) Appl. No.: 16/256,760

(22) Filed: Jan. 24, 2019

(65) Prior Publication Data
US 2019/0267262 A1    Aug. 29, 2019

(30) Foreign Application Priority Data

Feb. 28, 2018    (JP) .............................. JP2018-035489

(51) Int. Cl.
*H01L 21/67*      (2006.01)
*H01L 21/677*     (2006.01)
(Continued)

(52) U.S. Cl.
CPC .... *H01L 21/67115* (2013.01); *C23C 16/4412* (2013.01); *C23C 16/481* (2013.01);
(Continued)

(58) Field of Classification Search
CPC ............. H01L 21/324; H01L 21/67098; H01L 21/67115; H05B 3/0033; H05B 3/0047;
(Continued)

(56) References Cited

U.S. PATENT DOCUMENTS 5,735,961 A * 4/1998 Shimada ............. C23C 16/4401
118/724
2001/0019896 A1 9/2001 Choi et al.
(Continued)

FOREIGN PATENT DOCUMENTS

CN    106340474 A    1/2017
CN    106486351 A    3/2017
(Continued)

OTHER PUBLICATIONS

Japanese Notice of Reasons for Refusal issued in corresponding Japanese Patent Application No. 2018-035489, dated Nov. 16, 2021, with English translation.
(Continued)

*Primary Examiner* — John P. Dulka
(74) *Attorney, Agent, or Firm* — McDermott Will & Emery LLP

(57) ABSTRACT

When pressure in a chamber is brought to atmospheric pressure and the chamber is filled with an inert gas atmosphere, the atmosphere in the chamber is sucked into an oxygen concentration analyzer through a sampling line such that oxygen concentration in the chamber is measured by the oxygen concentration analyzer. When the pressure in the chamber is reduced to less than atmospheric pressure, nitrogen gas is supplied to the oxygen concentration analyzer through an inert gas supply line simultaneously with suspending the measurement of oxygen concentration in the chamber. Even when the measurement of oxygen concentration in the chamber is suspended, reverse flow to the oxygen concentration analyzer from a gas exhaust pipe can be prevented, and the oxygen concentration analyzer can be prevented from being exposed to exhaust from the chamber. The configuration results in maintaining measurement accu-
(Continued)

racy of the oxygen concentration analyzer in a low oxygen concentration range.

6 Claims, 9 Drawing Sheets

(51) Int. Cl.
    *C23C 16/48*     (2006.01)
    *C23C 16/44*     (2006.01)
    *C23C 16/52*     (2006.01)
    *H01L 21/687*     (2006.01)
    *H05B 3/00*     (2006.01)

(52) U.S. Cl.
    CPC .......... *C23C 16/482* (2013.01); *C23C 16/52* (2013.01); *H01L 21/67248* (2013.01); *H01L 21/67253* (2013.01); *H01L 21/67748* (2013.01); *H01L 21/6875* (2013.01); *H01L 21/68707* (2013.01); *H05B 3/0047* (2013.01)

(58) Field of Classification Search
    CPC .. C23C 16/481; C23C 16/482; C23C 16/4412
    See application file for complete search history.

(56) References Cited

U.S. PATENT DOCUMENTS

| | | | |
|---|---|---|---|
| 2006/0054088 A1 | 3/2006 | Jagawa et al. | |
| 2014/0161429 A1* | 6/2014 | Yokouchi | H01L 21/67115 392/416 |
| 2017/0011922 A1 | 1/2017 | Tanimura et al. | |
| 2017/0170039 A1 | 6/2017 | Aoyama et al. | |

FOREIGN PATENT DOCUMENTS

| | | | |
|---|---|---|---|
| CN | 106486397 A | | 3/2017 |
| JP | 10-321636 A | | 12/1998 |
| JP | 10321636 A | * | 12/1998 |
| JP | 2001-160554 A | | 6/2001 |
| JP | 2005-183655 A | | 7/2005 |
| JP | 2006-269596 A | | 10/2006 |
| JP | 2009-231676 A | | 10/2009 |
| JP | 2014-183247 A | | 9/2014 |
| JP | 2017-108036 A | | 6/2017 |
| KR | 1999-0034410 A | | 5/1999 |

OTHER PUBLICATIONS

Korean Notification of Reason for Refusal issued in corresponding Korean Patent Application No. 10-2019-0011208, dated Apr. 28, 2020, with English translation.
Korean Decision to Grant a Patent issued in corresponding Korean Patent Application No. 10-2019-0011208, dated Aug. 27, 2020.
Taiwanese Office Action issued in corresponding Taiwanese Patent Applicatin No. 108100800, dated Dec. 20, 2019, with English translation of the Japanese translation of the Taiwanese Office Action.
Chinese Office Action issued in corresponding Chinese Patent Application No. 201910073446, dated Dec. 1, 2022, with English translation.

* cited by examiner

F I G. 7
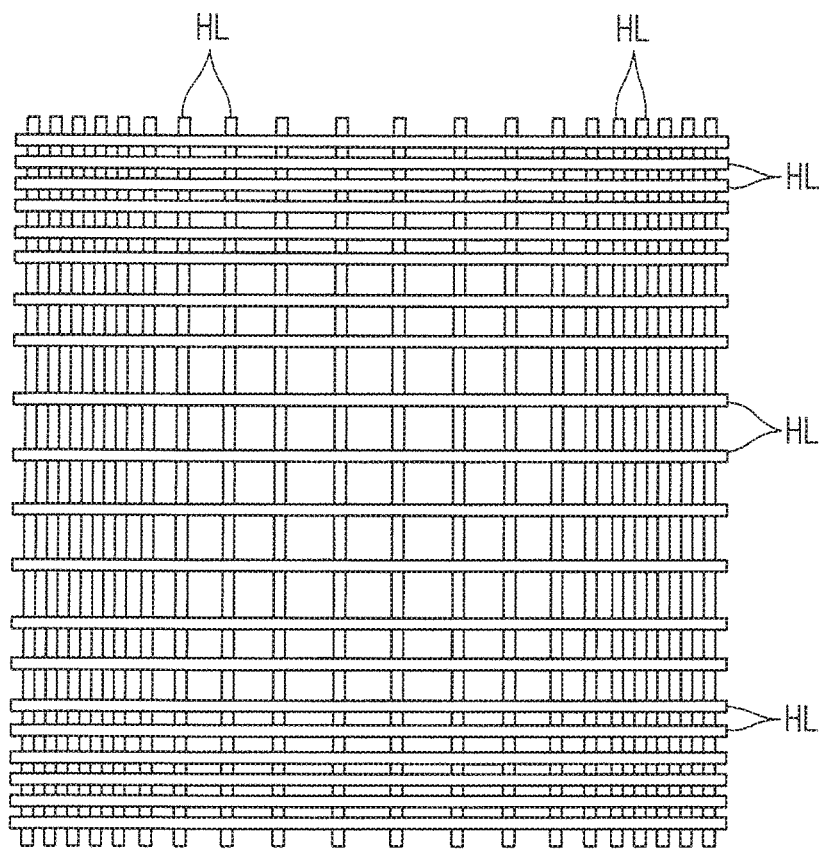

LIGHT IRRADIATION TYPE HEAT TREATMENT APPARATUS INCLUDING OXYGEN ANALYZER AND HEAT TREATMENT METHOD THEREOF

BACKGROUND OF THE INVENTION

Field of the Invention

The present invention relates to a heat treatment apparatus and a heat treatment method which irradiate a thin plate-like precision electronic substrate (hereinafter referred to simply as a "substrate") such as a semiconductor wafer with a flash of light to heat the substrate.

Description of the Background Art

In the process of manufacturing a semiconductor device, attention has been given to flash lamp annealing (FLA) which heats a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

Such flash lamp annealing is used for processes that require heating in an extremely short time, for example, typically for the activation of impurities implanted in a semiconductor wafer. The irradiation of a surface of a semiconductor wafer implanted with impurities by an ion implantation process with a flash of light from flash lamps allows the temperature rise to an activation temperature only in the surface of the semiconductor wafer in an extremely short time, thereby achieving only the activation of impurities without deep diffusion of the impurities.

The problem of oxidation is encountered not only in the flash lamp annealing but also in heat treatment for heating a semiconductor wafer. It is hence important to control the concentration of oxygen in a chamber that receives a semiconductor wafer therein. In Japanese Patent Application Laid-Open No. 2006-269596, it is disclosed that an oxygen analyzer is provided in a chamber of a heat treatment apparatus including flash lamps to measure the concentration of oxygen during the treatment. In general, it is more preferable that the concentration of oxygen in a chamber is lower for the purpose of preventing oxidation during heating treatment.

Typically, the oxygen concentration analyzer takes a sample of atmosphere in the chamber to measure oxygen concentration in the gas taken as a sample. Then, the gas used for the measurement is exhausted to an exhaust line for exhausting atmosphere in the chamber, for example.

Incidentally, the oxygen concentration analyzer does not measure oxygen concentration in the chamber constantly. The oxygen concentration analyzer suspends the measurement of oxygen concentration when pressure in the chamber is reduced, for example, because taking a sample of the atmosphere in the chamber becomes difficult. The oxygen concentration analyzer suspends the measurement of oxygen concentration also when reactive gas (such as ammonia) is supplied into the chamber.

At the same time, some purposes of the process of flash lamp annealing require an even lower oxygen environment inside the chamber that receives a semiconductor wafer. As an example, a high dielectric constant film (a high-k film) that uses a material (high dielectric constant material) having a higher dielectric constant than that of silicon dioxide ($SiO_2$) may be formed as a gate insulator film of a field effect transistor (FET). When flash lamp annealing is used to perform heat treatment on a semiconductor wafer on which such a high dielectric constant film is formed, a low oxygen concentration environment (1 ppm or less), which is even lower than that in a conventional method, is required in order to reduce increase in the thickness of the oxide film. Accordingly, in measuring oxygen concentration in the chamber, the oxygen concentration analyzer needs to enhance measurement accuracy in a low oxygen concentration range of 1 ppm or less.

However, when the oxygen concentration analyzer suspends the measurement of oxygen concentration, a gas may reversely flow from the exhaust side of the oxygen concentration analyzer because the oxygen concentration analyzer stops taking a sample of a gas from the chamber. This causes a sensor of the oxygen concentration analyzer to come in contact with a high oxygen concentration gas, depriving the oxygen concentration analyzer of the measurement function in a low oxygen concentration range. As a result, there is a fear in that the oxygen concentration analyzer is incapable of measuring oxygen concentration in a low oxygen concentration range when resuming the measurement of the oxygen concentration.

SUMMARY

The present invention is intended for a heat treatment apparatus for irradiating a substrate with light to heat the substrate.

According to one aspect of the present invention, the heat treatment apparatus includes a chamber, an exhaust line, a lamp, an oxygen concentration analyzer, a sampling line, and an inert gas supply line. The chamber receives a substrate therein. The exhaust line exhausts atmosphere in the chamber. The lamp irradiates the substrate received in the chamber with light. The oxygen concentration analyzer sucks atmosphere in the chamber to measure oxygen concentration in the chamber. The oxygen concentration analyzer exhausts a gas sucked from the chamber and used for the measurement of oxygen concentration to the exhaust line. The sampling line connects the chamber and the oxygen concentration analyzer in communication, and introduces atmosphere in the chamber to the oxygen concentration analyzer. The inert gas supply line supplies inert gas to the oxygen concentration analyzer. When the sampling line is closed to suspend the measurement of oxygen concentration in the chamber, inert gas is supplied to the oxygen concentration analyzer through the inert gas supply line.

The configuration prevents reverse flow to the oxygen concentration analyzer from the exhaust line, thereby maintaining measurement accuracy in a low oxygen concentration range.

Preferably, oxygen concentration of the inert gas supplied through the inert gas supply line is lower than oxygen concentration in the chamber.

The configuration maintains measurement function of the oxygen concentration analyzer at least for the oxygen concentration in the chamber.

Preferably, the heat treatment apparatus further includes a flow rate adjustment mechanism. The flow rate adjustment mechanism makes a flow rate of the inert gas supplied to the oxygen concentration analyzer through the inert gas supply line equal to a flow rate of the gas introduced to the oxygen concentration analyzer from the chamber. The flow rate adjustment mechanism is provided in the inert gas supply line.

The configuration reduces variation in the flow rate of the gas flowing into the oxygen concentration analyzer, thereby maintaining measurement accuracy of the oxygen concentration analyzer.

Preferably, the sampling line is made of stainless steel.

The configuration completely blocks permeation of oxygen through a pipe, thereby maintaining measurement accuracy of the oxygen concentration analyzer in a low oxygen concentration range.

Preferably, when reactive gas is supplied into the chamber, the sampling line is continuously closed for a period of predetermined setting time since the supply of the reactive gas is stopped.

The configuration prevents the reactive gas remaining inside the chamber from being sucked into the oxygen concentration analyzer.

The present invention is also intended for a heat treatment method of irradiating a substrate with light to heat the substrate.

According to one aspect of the present invention, the heat treatment method includes the following steps (a) to (d). The step (a) is to irradiate a substrate received in a chamber with light from a lamp. The step (b) is to exhaust atmosphere in the chamber to an exhaust line. The step (c) is to introduce atmosphere in the chamber to an oxygen concentration analyzer through a sampling line to measure oxygen concentration in the chamber, and to exhaust a gas used for the measurement of oxygen concentration to the exhaust line. The step (d) is to supply inert gas to the oxygen concentration analyzer when the step (c) is suspended.

The configuration prevents reverse flow to the oxygen concentration analyzer from the exhaust line, thereby maintaining measurement accuracy in a low oxygen concentration range.

Preferably, oxygen concentration of the inert gas supplied to the oxygen concentration analyzer in the step (d) is lower than oxygen concentration in the chamber.

The configuration maintains measurement function of the oxygen concentration analyzer at least for the oxygen concentration in the chamber.

Preferably, a flow rate of the inert gas supplied to the oxygen concentration analyzer in the step (d) is made to be equal to a flow rate of the gas introduced to the oxygen concentration analyzer from the chamber in the step (c).

The configuration reduces variation in the flow rate of the gas flowing into the oxygen concentration analyzer, thereby maintaining measurement accuracy of the oxygen concentration analyzer.

Preferably, the sampling line is made of stainless steel.

The configuration completely blocks permeation of oxygen through a pipe, thereby maintaining measurement accuracy of the oxygen concentration analyzer in a low oxygen concentration range.

Preferably, when reactive gas is supplied into the chamber, the step (c) is continuously suspended for a period of predetermined setting time since the supply of the reactive gas is stopped.

The configuration prevents the reactive gas remaining inside the chamber from being sucked into the oxygen concentration analyzer.

Therefore, the object of the present invention is to maintain measurement accuracy in a low oxygen concentration range even when measurement of oxygen concentration is suspended.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a plan view showing an arrangement of halogen lamps;

DESCRIPTION OF THE PREFERRED EMBODIMENTS

A preferred embodiment according to the present invention will now be described in detail with reference to the drawings.

Figure 1:
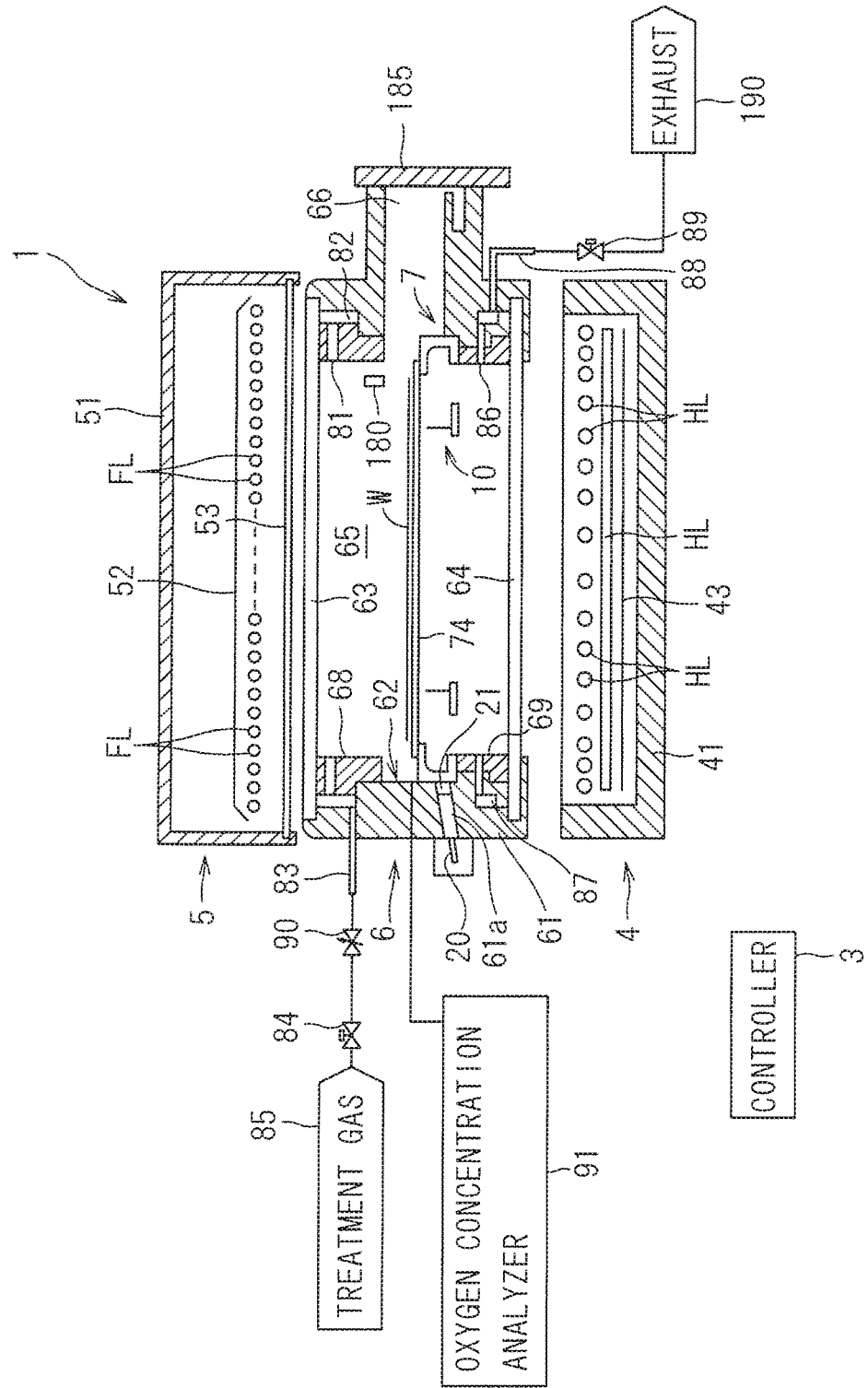
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 of FIG. 1 is a flash lamp annealer for irradiating a disk-shaped semiconductor wafer W serving as a substrate with a flash of light to heat the semiconductor wafer W. The size of the semiconductor wafer W to be treated is not particularly limited. For example, the semiconductor wafer W to be treated has a diameter of 300 mm and 450 mm (in this preferred embodiment, a diameter of 300 mm). A high dielectric constant film (a high-k film) is formed as a gate insulator film on the semiconductor wafer W prior to the transport into the heat treatment apparatus 1, and the heat treatment apparatus 1 performs a heating treatment on the semiconductor wafer W to thereby perform PDA (post deposition annealing) on the high dielectric constant film. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes an oxygen concentration analyzer 91 for measuring oxygen concentration in the chamber 6. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits a flash of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

Further, a through hole 61a is bored in the chamber side portion 61. A radiation thermometer 20 is mounted at a portion on an outer wall surface of the chamber side portion 61 where the through hole 61a is provided. The through hole 61a is a cylindrical hole for introducing, to the radiation thermometer 20, infrared radiation emitted from the lower surface of the semiconductor wafer W held by a susceptor 74 (to be described later). The through hole 61a is provided to be inclined with respect to the horizontal direction such that an axis of its penetrating direction crosses a main surface of the semiconductor wafer W held by the susceptor 74. A transparent window 21 is mounted to an end portion of the through hole 61a facing the heat treatment space 65 side. The transparent window 21 is made of a barium fluoride material and transmits infrared radiation in a wavelength range that can be measured by the radiation thermometer 20. The radiation thermometer 20 receives infrared radiation emitted from the lower surface of the semiconductor wafer W and transmitted through the transparent window 21, to thereby measure temperature of the semiconductor wafer W based on the intensity of the infrared radiation.

At least one gas supply opening 81 for supplying a treatment gas (in this preferred embodiment, nitrogen ($N_2$) gas and ammonia ($NH_3$)) therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. The treatment gas supply source 85 feeds nitrogen gas or mixed gas of ammonia and nitrogen gas as the treatment gas to the gas supply pipe 83 under the control of the controller 3. A valve 84 and a flow rate adjustment valve 90 are inserted at some midpoint in the gas supply pipe 83. When the valve 84 is opened, the treatment gas is fed from the treatment gas supply source 85 to the buffer space 82. The flow rate of the treatment gas flowing through the gas supply pipe 83 to be fed to the buffer space 82 is adjusted by the flow rate adjustment valve 90. The flow rate of the treatment gas regulated by the flow rate adjustment valve 90 is variable in accordance with the control of the controller 3. The treatment gas flowing in the buffer space 82 flows in a spreading manner within the buffer space 82 which is lower in fluid resistance than the gas supply opening 81, and is supplied through the gas supply opening 81 into the heat treatment space 65. It should be noted that the treatment gas is not limited to nitrogen gas and ammonia, but may be inert gases such as argon (Ar) and helium (He), and reactive gases such as oxygen ($O_2$), hydrogen ($H_2$), chlorine ($Cl_2$), hydrogen chloride (HCl), ozone ($O_3$), nitrogen monoxide (NO), nitrous oxide ($N_2O$), and nitrogen dioxide ($NO_2$)).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. When the valve 89 is opened to only exhaust the gas from the heat treatment space 65 while the valve 84 is closed so as not to supply the treatment gas into the heat treatment space 65, the pressure in the heat treatment space 65 of the chamber 6 is reduced to less than atmospheric pressure. The exhaust part 190 includes an exhaust flow rate adjustment mechanism (such as a flow rate adjustment valve) (not shown). Further, a pressure gauge 180 for measuring the pressure of the heat treatment space 65 is provided inside the chamber 6. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The treatment gas supply source 85 and the exhaust part 190 may be mechanisms provided in the heat treatment apparatus 1 or be utility systems in a factory in which the heat treatment apparatus 1 is installed.

Figure 2:
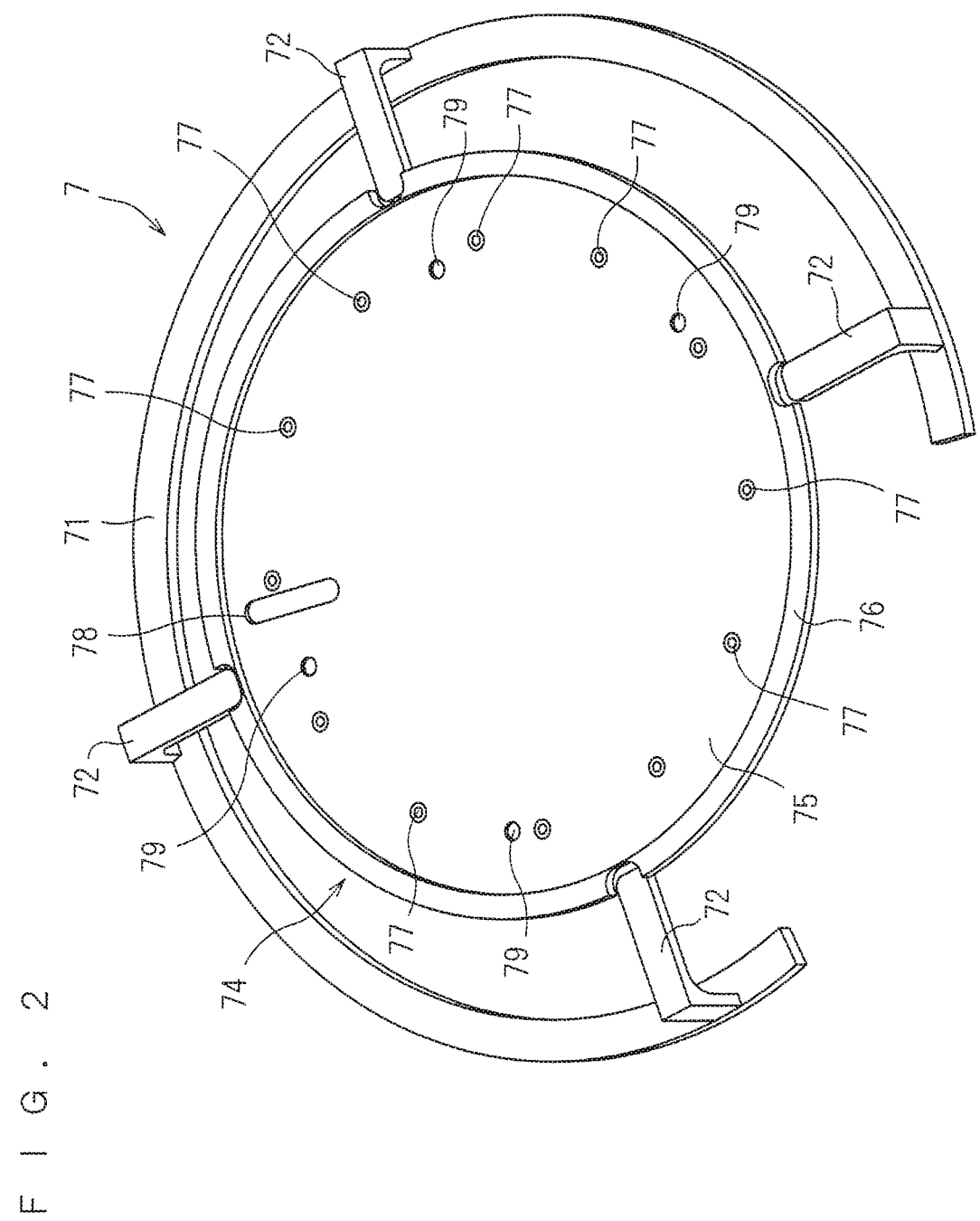
FIG. 2 is a perspective view showing the entire external appearance of a holder.

FIG. 2 is a perspective view showing the entire external appearance of the holder 7. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member in the form of an arcuate shape such that a portion is removed from an annular ring. The removed portion is provided to avoid interference between transfer arms 11 (to be described later) of the transfer mechanism 10 and the base ring 71. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape of the base ring 71. The coupling portions 72 are quartz members, and are rigidly secured to the base ring 71 by welding.

Figure 3:
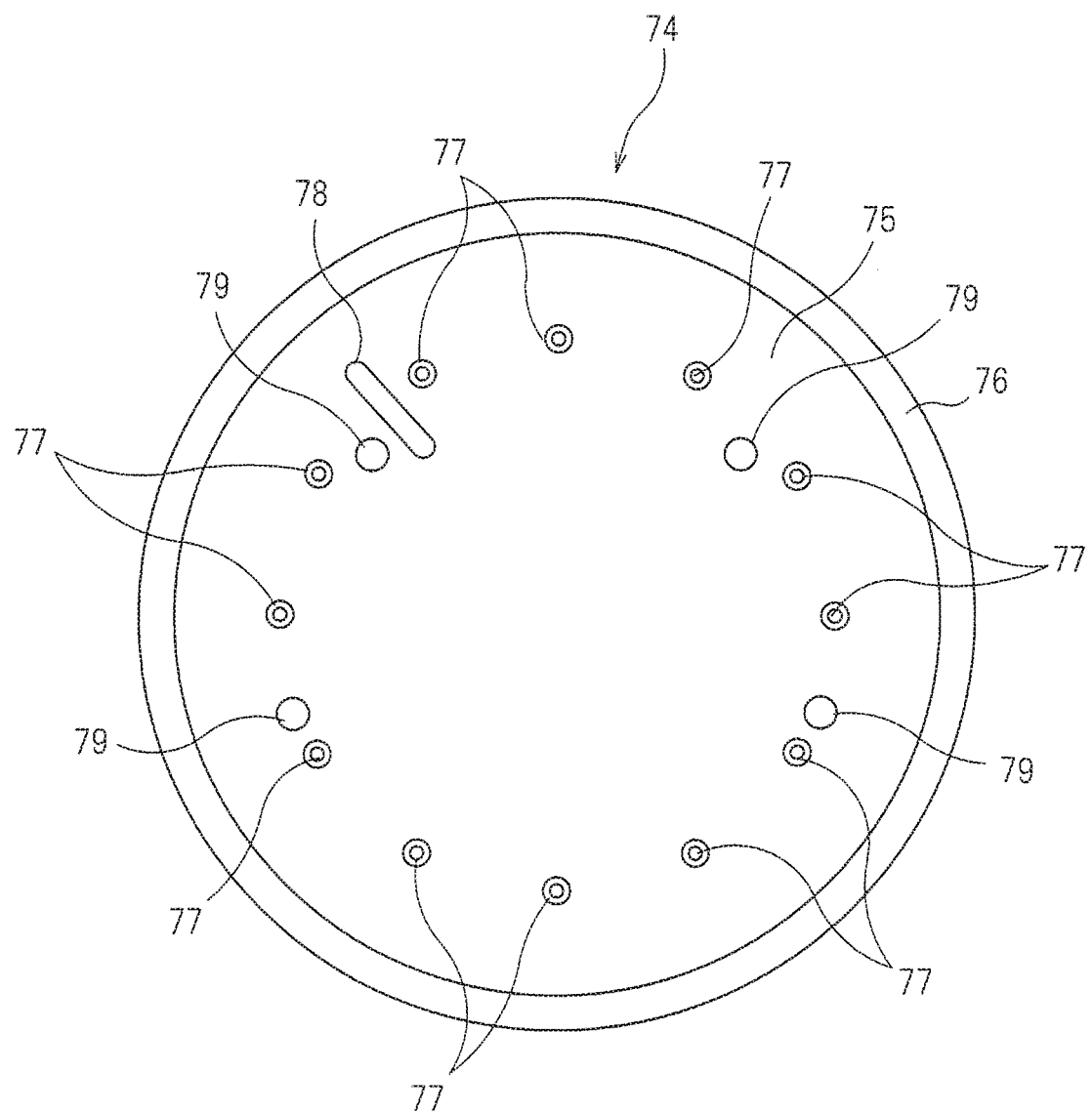
FIG. 3 is a plan view of a susceptor.
Figure 4:
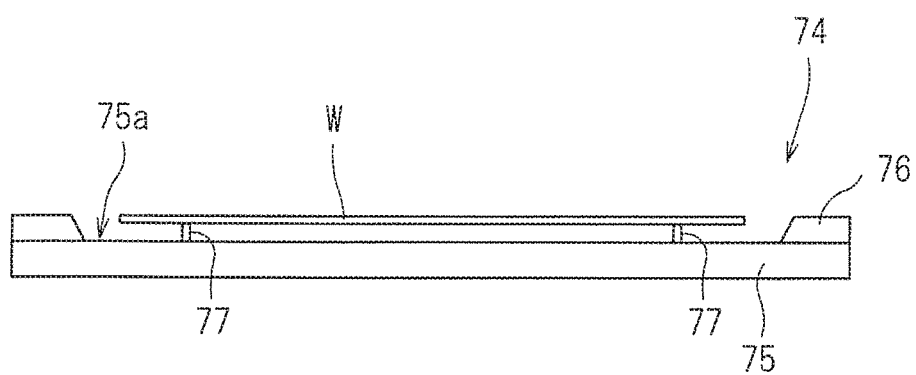
FIG. 4 is a cross sectional view of the susceptor.

The susceptor 74 is supported by the four coupling portions 72 provided on the base ring 71. FIG. 3 is a plan view of the susceptor 74. FIG. 4 is a cross sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided along a peripheral portion of the upper surface of the holding plate 75. The guide ring 76 is an annular member having an inner diameter greater than the diameter of a semiconductor wafer W. For example, when the diameter of the semiconductor wafer W is 300 mm, the inner diameter of the guide ring 76 is 320 mm. The inner circumference of the guide ring 76 is formed into a tapered surface that widens toward the upper side from the holding plate 75. The guide ring 76 is made of quartz of a similar kind to that of the holding plate 75. The guide ring 76 may be welded to the upper surface of the holding plate 75, or may be fixed to the holding plate 75 using separately machined pins or the like. Alternatively, the holding plate 75 and the guide ring 76 may be machined as one integrated member.

A region of the upper surface of the holding plate 75 located on the inside of the guide ring 76 serves as a holding surface 75a. The holding surface 75a has a planar surface and holds the semiconductor wafer W. A plurality of substrate support pins 77 are mounted upright on the holding surface 75a of the holding plate 75. In this preferred embodiment, a total of twelve substrate support pins 77 are mounted upright at every 30° along the circumference of a circle concentric with the outer circumference of the holding surface 75a (inner circumference of the guide ring 76). The diameter (a distance between opposing substrate support pins 77) of a circle along which the twelve substrate support pins 77 are disposed is slightly smaller than the diameter of the semiconductor wafer W. When the diameter of the semiconductor wafer W is 300 mm, the diameter of the circle is 270 mm to 280 mm (in this preferred embodiment, a diameter of 270 mm). Each of the substrate support pins 77 is also made of quartz. The plurality of substrate support pins 77 may be welded onto the upper surface of the holding plate 75, or may be machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the susceptor 74 coincides with a vertical direction). In other words, the holding surface 75a of the holding plate 75 is a horizontal surface.

A semiconductor wafer W transported into the chamber 6 is placed and held in a horizontal attitude on the susceptor 74 of the holder 7 mounted to the chamber 6. In this case, the semiconductor wafer W is supported by the twelve substrate support pins 77 mounted upright on the holding plate 75 so as to be held by the susceptor 74. More strictly, the upper end portions of the twelve substrate support pins 77 come in contact with the lower surface of the semiconductor wafer W, thereby supporting the semiconductor wafer W. The twelve substrate support pins 77 have a uniform height (distance from the upper end of the substrate support pin 77 to the holding surface 75a of the holding plate 75), and therefore the twelve substrate support pins 77 can support the semiconductor wafer W in a horizontal attitude.

Further, the plurality of substrate support pins 77 support the semiconductor wafer W so as to form a predetermined clearance between the semiconductor wafer W and the holding surface 75a of the holding plate 75. The thickness of the guide ring 76 is larger than the height of the substrate support pins 77. Thus, the guide ring 76 prevents horizontal misregistration of the semiconductor wafer W supported by the plurality of substrate support pins 77.

As shown in FIGS. 2 and 3, an opening 78 is provided in the holding plate 75 of the susceptor 74 so as to extend vertically through the holding plate 75 of the susceptor 74. The opening 78 is provided such that the radiation thermometer 20 receives radiation (infrared radiation) emitted from the lower surface of the semiconductor wafer W. Specifically, the radiation thermometer 20 receives light emitted from the lower surface of the semiconductor wafer W and transmitted through the opening 78 and the transparent window 21 mounted at the through hole 61a of the chamber side portion 61, to thereby measure temperature of the semiconductor wafer W. The holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
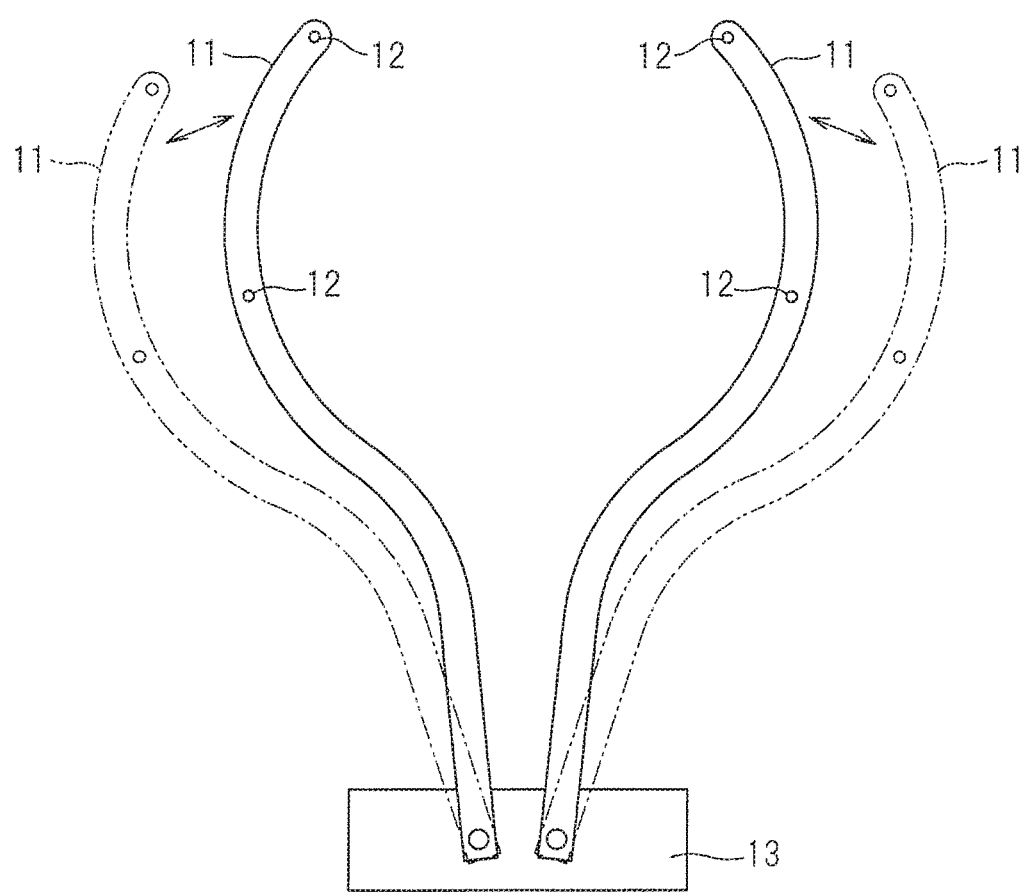
FIG. 5 is a plan view of a transfer mechanism.
Figure 6:
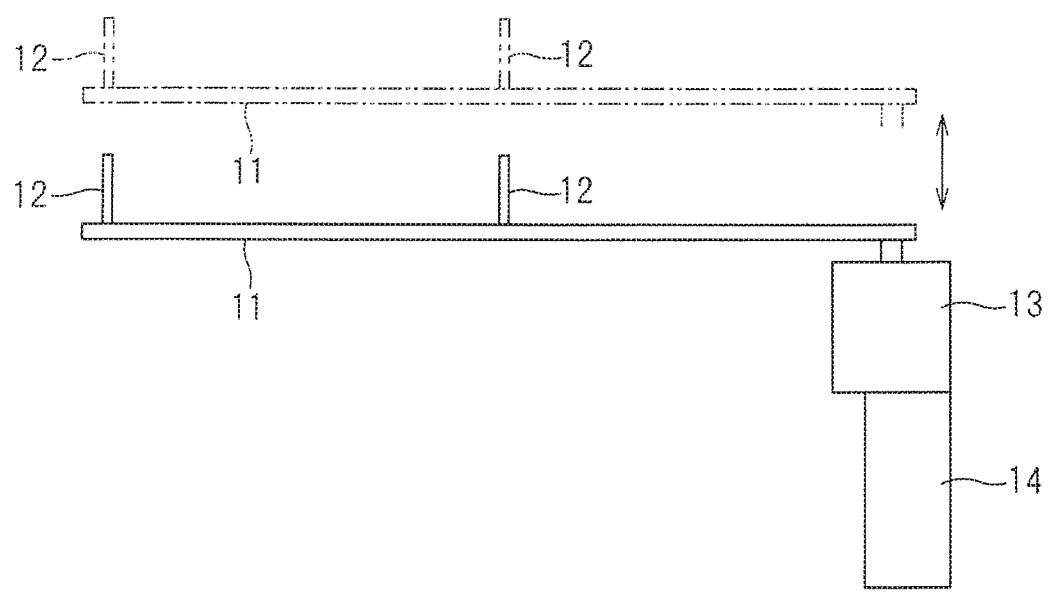
FIG. 6 is a side view of the transfer mechanism.

FIG. 5 is a plan view of the transfer mechanism 10. FIG. 6 is a side view of the transfer mechanism 10. The transfer mechanism 10 includes a pair of transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. It should be noted that an exhaust mechanism (not shown) is also provided near a position where the drive part (the horizontal movement mechanism 13 and the elevating mechanism 14) of the transfer mechanism 10 is provided. This configuration allows the atmosphere around the drive part of the transfer mechanism 10 to be exhausted to the outside of the chamber 6.

Figure 8:
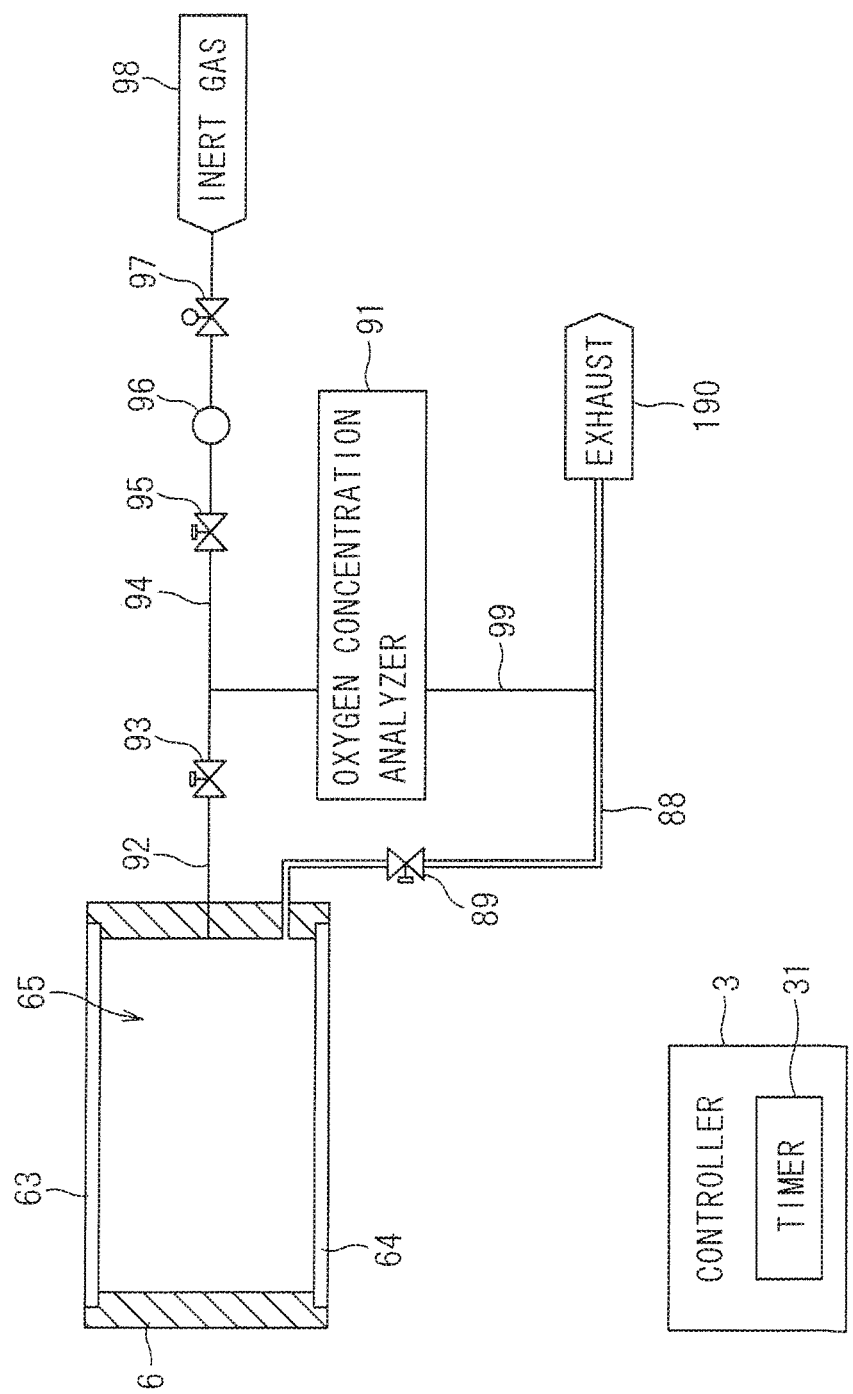
FIG. 8 is a diagram schematically showing a peripheral configuration of an oxygen concentration analyzer.

The heat treatment apparatus 1 includes an oxygen concentration analyzer 91 for measuring oxygen concentration in the chamber 6. FIG. 8 is a diagram schematically showing a peripheral configuration of the oxygen concentration analyzer 91. The oxygen concentration analyzer 91 and the chamber 6 are connected in communication with each other by a sampling line 92. In other words, a distal end of the sampling line 92 is connected to the inside of the chamber side portion 61 of the chamber 6, and a proximal end thereof is connected to the oxygen concentration analyzer 91. The sampling line 92 is a pipe for introducing the atmosphere in the chamber 6 to the oxygen concentration analyzer 91. A valve 93 is provided at some midpoint in the sampling line 92. When the valve 93 is opened, the heat treatment space 65 in the chamber 6 and the oxygen concentration analyzer 91 are communicated with each other.

Further, an inert gas supply line 94 is connected at a midpoint (at a position closer to the oxygen concentration analyzer 91 than to the valve 93) in the sampling line 92. The inert gas supply line 94 is a pipe for supplying inert gas to the oxygen concentration analyzer 91 through a part of the sampling line 92. A distal end of the inert gas supply line 94 is connected to a midpoint in the sampling line 92, and a proximal end thereof is connected to an inert gas supply source 98. A valve 95, an orifice 96, a pressure-reducing valve 97 are inserted at some midpoint in the inert gas supply line 94.

When the valve 95 is opened, inert gas (in this preferred embodiment, nitrogen gas) is fed to the oxygen concentration analyzer 91 from the inert gas supply source 98. The pressure-reducing valve 97 is a valve for reducing the pressure of the nitrogen gas fed from the inert gas supply source 98. The orifice 96 has an opening of a diameter of 0.1 mm, for example, and adjusts conductance of the inert gas supply line 94. Specifically, the orifice 96 makes an adjustment so that conductance of the inert gas supply line 94 is equal to conductance of the sampling line 92 (more strictly, conductance from the distal end of the sampling line 92 to a joining portion of the inert gas supply line 94). The pressure-reducing valve 97 reduces the supply pressure of the nitrogen gas, and the orifice 96 makes an adjustment so that the conductance of the inert gas supply line 94 is equal to the conductance of the sampling line 92. With this configuration, the flow rate of the inert gas supplied to the oxygen concentration analyzer 91 from the inert gas supply source 98 through the inert gas supply line 94 can be equal to the flow rate of a gas introduced to the oxygen concentration analyzer 91 from the chamber 6 through the sampling line 92.

The sampling line 92 and the inert gas supply line 94 are made of stainless steel (e.g., SUS316 or SUS304 by Japanese Industrial Standards). The sampling line 92 and the inert gas supply line 94 are preferably made of the same material as that of the chamber 6.

The oxygen concentration analyzer 91 includes a concentration sensor and a suction pump (both not shown). When the valve 93 is opened, the suction pump of the oxygen concentration analyzer 91 sucks the atmosphere in the chamber 6 through the sampling line 92. The oxygen sensor is, for example, a zirconia type oxygen concentration sensor employing stabilized zirconia. The stabilized zirconia is obtained by adding yttria ($Y_2O_3$) serving as a stabilizer to zirconia ($ZrO_2$). The stabilized zirconia is excellent in ionic conductivity, and becomes a solid electrolyte at high temperatures. When there is a difference in oxygen concentration between opposite sides of the zirconia solid electrolyte at high temperatures (e.g., approximately 700° C.), oxygen ions ($O^{2-}$) are produced on the high oxygen concentration side by a reduction reaction. The oxygen ions move in the zirconia solid electrolyte, and are turned into oxygen ($O_2$) on the low oxygen concentration side by an oxidation reaction.

The transfer of electrons in the oxidation and reduction reactions on the opposite sides of the zirconia solid electrolyte produces an electromotive force. The magnitude of the electromotive force is determined by the difference in oxygen concentration. Thus, the electromotive force is measured when a gas to be measured is brought into contact with one side of the zirconia solid electrolyte at high temperature while a reference gas having a known oxygen concentration is in contact with the opposite side thereof. This achieves a measurement of the oxygen concentration of the gas to be measured. The oxygen concentration analyzer 91 uses such a principle to measure oxygen concentration in the gas sucked from the chamber 6, to thereby measure the oxygen concentration in the chamber 6.

An exhaust pipe 99 connects the oxygen concentration analyzer 91 to the gas exhaust pipe 88 as an exhaust line for exhausting the atmosphere in the chamber 6. The oxygen concentration analyzer 91 exhausts the gas sucked from the chamber 6 and used for the measurement of oxygen concentration through the exhaust pipe 99 to the gas exhaust pipe 88.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct a flash of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along the main surface of a semiconductor wafer W held by the holder 7 (that is, in a horizontal direction). Thus, a plane defined by the arrangement of the flash lamps FL is also a horizontal plane. The region where the flash lamps FL are arranged has a size, as seen in plan view, greater than that of the semiconductor wafer W.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 directs light from under the chamber 6 through the lower chamber window 64 toward the heat treatment space 65 to heat the semiconductor wafer W by means of the halogen lamps HL.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along the main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps which emit light continuously at least for a time period of not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed. Also, the controller 3 controls the opening and closing of the valve 93 of the sampling line 92 and the valve 95 of the inert gas supply line 94. The controller 3 further includes a timer 31 having a timing function (FIG. 8).

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a procedure for the treatment in the heat treatment apparatus 1 will be described. A semiconductor wafer W to be treated herein is a silicon semiconductor substrate on which a high dielectric constant film is formed as a gate insulator film. The high dielectric constant film is, for example, formed by being deposited on a surface of the semiconductor wafer W using methods such as atomic layer deposition (ALD) and metal organic chemical vapor deposition (MOCVD). The heat treatment apparatus 1 irradiates the semiconductor wafer W with a flash of light in an ammonia atmosphere to perform post deposition annealing (PDA) on the semiconductor wafer W such that defects in the deposited high dielectric constant film are eliminated. The procedure for the treatment in the heat treatment apparatus 1 to be described below proceeds under the control of the controller 3 over the operating mechanisms of the heat treatment apparatus 1.

First, the semiconductor wafer W on which a high dielectric constant film is formed is transported into the chamber 6 of the heat treatment apparatus 1. For the transport of the semiconductor wafer W into the chamber 6, the gate valve 185 is opened to open the transport opening 66. A transport robot outside the heat treatment apparatus 1 transports the semiconductor wafer W on which a high dielectric constant film is formed through the transport opening 66 into the heat treatment space 65 of the chamber 6. At this time, because the pressure inside and outside the chamber 6 is atmospheric pressure, the atmosphere outside the heat treatment apparatus 1 is brought into the heat treatment space 65 of the chamber 6 when the semiconductor wafer W is transported into the chamber 6. In view of this, nitrogen gas may be continuously supplied into the chamber 6 from the treatment gas supply source 85 by opening the valve 84 to cause the nitrogen gas to flow outwardly through the transport opening 66, thereby minimizing the atmosphere outside the apparatus flowing into the chamber 6.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 are moved upwardly beyond the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held from the lower side in a horizontal attitude. The semiconductor wafer W is supported by the plurality of substrate support pins 77 mounted upright on the holding plate 75, thereby being held by the susceptor 74. Also, the semiconductor wafer W is held on the susceptor 74 in such an attitude that a front surface thereof where the high dielectric constant film is deposited is the upper surface. A predetermined clearance is formed between the back surface (another main surface opposite to the front surface) of the semiconductor wafer W supported by the plurality of substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

At the time point when the semiconductor wafer W is received in the chamber 6 and the transport opening 66 is closed by the gate valve 185, the pressure inside the chamber 6 is brought to an ordinary pressure (i.e., atmospheric pressure). In addition, a nitrogen gas is supplied to the chamber 6 from the gas supply opening 81 and a gas in the heat treatment space 65 is exhausted through the gas exhaust opening 86, causing the chamber 6 to be filled with a nitrogen atmosphere. When the chamber 6 has an ordinary pressure and the chamber 6 is filled with an atmosphere of an inert gas such as a nitrogen gas, the valve 93 of the sampling line 92 is opened and the valve 95 of the inert gas supply line 94 is closed in accordance with an operation command from the controller 3. With this, the atmosphere in the chamber 6 is sucked into the oxygen concentration analyzer 91 through the sampling line 92 such that oxygen concentration in the chamber 6 is measured by the oxygen concentration analyzer 91. The gas sucked from the chamber 6 and used for the measurement of oxygen concentration is exhausted from the oxygen concentration analyzer 91 to the gas exhaust pipe 88.

Figure 9:
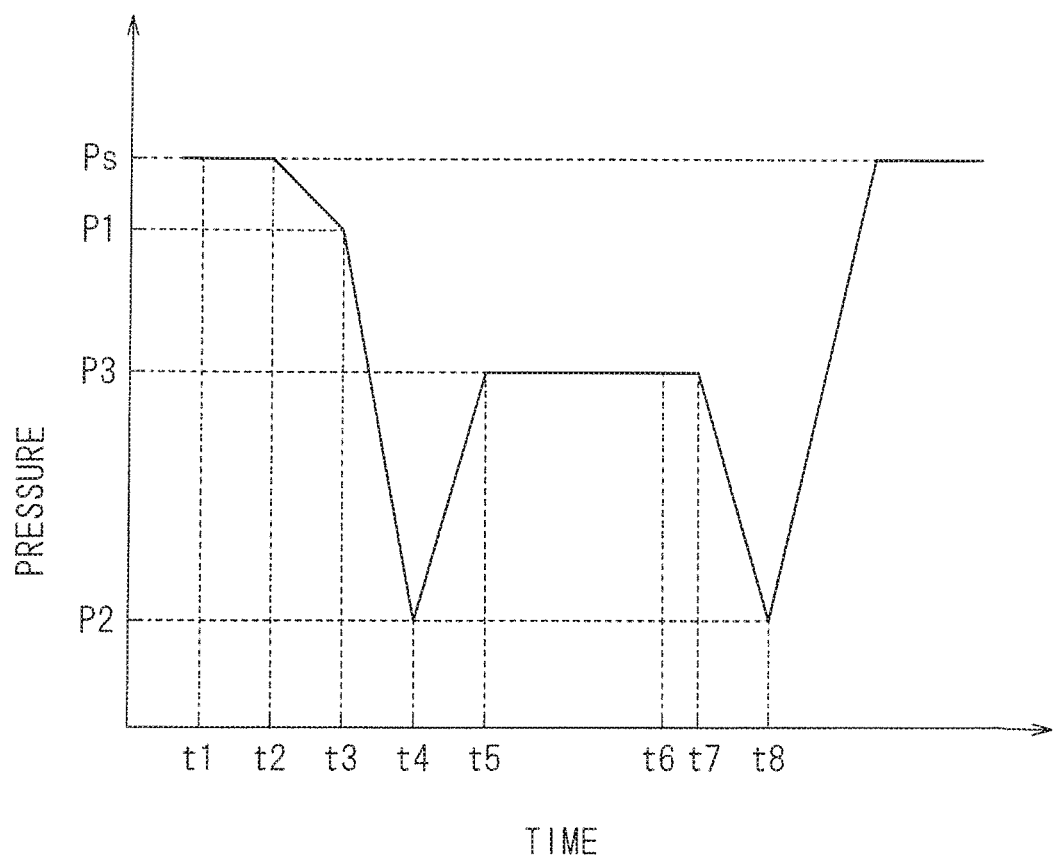
FIG. 9 is a graph showing pressure change in a chamber.

Further, after the semiconductor wafer W is received in the chamber 6 and the transport opening 66 is closed by the gate valve 185, the pressure in the chamber 6 is reduced to less than atmospheric pressure. FIG. 9 is a graph showing pressure change in the chamber 6. After the semiconductor wafer W is transported into the chamber 6 having atmospheric pressure Ps (=approximately 101325 Pa) at time t1, the transport opening 66 is closed by the gate valve 185, so that the heat treatment space 65 of the chamber 6 becomes an enclosed space. At this time, the valve 84 and the valve 89 are both opened to supply a nitrogen gas into the chamber 6 and to exhaust the atmosphere in the chamber 6 such that the chamber 6 is filled with a nitrogen atmosphere. In this state, the valve 89 is opened while the valve 84 is closed in accordance with an operation command from the controller 3 at time t2. Thus, the gas is exhausted from the chamber 6 while the gas is not supplied into the chamber 6, so that the pressure in the heat treatment space 65 of the chamber 6 is reduced to less than atmospheric pressure.

Further, the controller 3 controls the exhaust part 190 to exhaust a gas at a relatively low exhaust flow rate from time t2 to time t3 such that pressure is brought to pressure P1 (e.g., approximately 20000 Pa). Subsequently, the controller 3 increases the exhaust flow rate at time t3. In other words, the gas is exhausted at a low exhaust flow rate in the initial stage of pressure reduction, and then the exhaust flow rate is switched to a higher exhaust flow rate to exhaust the gas at the higher exhaust flow rate. If the gas is rapidly exhausted at a high exhaust flow rate from the start of reduction pressure, the airflow may be largely changed in the chamber 6, blowing up particles adhering to the structure (such as the lower chamber window 64) of the chamber 6. There is a fear in that, if the blown up particles settle and adhere onto the semiconductor wafer W, the semiconductor wafer W may be unfavorably contaminated. Such blowing up of particles in the chamber 6 can be prevented by exhausting a gas gently at a low exhaust flow rate in the initial stage of pressure reduction, and then switching the exhaust flow rate to a higher exhaust flow rate to exhaust a gas at the higher exhaust flow rate.

After a while, the pressure (degree of vacuum) of the chamber 6 reaches pressure P2 at time t4. The pressure P2 is approximately 100 Pa, for example. At the time t4 when the pressure in the chamber 6 reaches the pressure P2, the valve 84 for supplying the gas is opened such that the treatment gas supply source 85 supplies a mixed gas of ammonia and nitrogen gas as a dilution gas into the heat treatment space 65 in the chamber 6. Consequently, an ammonia atmosphere is formed around the semiconductor wafer W held by the holder 7 in the chamber 6. The concentration of ammonia in the ammonia atmosphere (i.e., mixing ratio of ammonia and nitrogen gas) is not particularly limited, and may have an appropriate value. As an example, the concentration of ammonia is preferably 10 vol. % or less (in this preferred embodiment, approximately 2.5 vol. %).

The supply of the mixed gas into the chamber 6 increases the pressure in the chamber 6 from the pressure P2, bringing the pressure back up to pressure P3 at time t5. The pressure P3, which is a pressure at which the semiconductor wafer W is processed, is higher than the pressure P2 and lower than the atmospheric pressure Ps, and is approximately 5000 Pa, for example. After the time t5 when the pressure in the chamber 6 is brought back to the pressure P3, the flow rate for supplying the mixed gas of ammonia and nitrogen to the chamber 6 and the flow rate for exhausting a gas from the chamber 6 are made to be substantially equal to each other to maintain the pressure in the chamber 6 to be the pressure P3.

During a time period between the time t1 and the time t2 when the pressure in the chamber 6 is brought to be atmospheric pressure, as in the above description, the valve 93 of the sampling line 92 is opened and the valve 95 of the inert gas supply line 94 is closed such that the oxygen concentration analyzer 91 measures oxygen concentration in the chamber 6. After the time t2 when the pressure in the chamber 6 is reduced to less than atmospheric pressure, the valve 93 of the sampling line 92 is closed in accordance with an operation command from the controller 3. With this, the suction of the atmosphere from the chamber 6 is stopped, and the measurement of oxygen concentration in the chamber 6 is thereby suspended. Also, the valve 95 of the inert gas supply line 94 is opened simultaneously with the closing of the valve 93 of the sampling line 92. With this, nitrogen gas as inert gas is supplied to the oxygen concentration analyzer 91 through the inert gas supply line 94 simultaneously with stopping the suction of the atmosphere from the chamber 6. In supplying nitrogen gas through the inert gas supply line 94, the pressure-reducing valve 97 reduces the supply pressure of nitrogen gas, and the orifice 96 makes an adjustment so that conductance of the inert gas supply line 94 is equal to conductance of the sampling line 92. Therefore, the flow rate of nitrogen gas supplied to the oxygen concentration analyzer 91 through the inert gas supply line 94 is equal to the flow rate of a gas introduced to the oxygen concentration analyzer 91 from the chamber 6 through the sampling line 92 when oxygen concentration in the chamber 6 is measured.

Further, oxygen concentration of the nitrogen gas supplied to the oxygen concentration analyzer 91 through the inert gas supply line 94 is arranged to be lower than oxygen concentration in the chamber 6 when the oxygen concentration is measured. Even at atmospheric pressure, the oxygen concentration in the chamber 6 is approximately 0.1 ppm, whereas the oxygen concentration of the nitrogen gas supplied to the oxygen concentration analyzer 91 through the inert gas supply line 94 is less than 0.1 ppm.

After the time t5 when the pressure in the chamber 6 is brought back to the pressure P3, the 40 halogen lamps HL in the halogen heating part 4 turn on simultaneously to start the preheating (or assist-heating) of the semiconductor wafer W. Halogen light emitted from the halogen lamps HL is transmitted through the lower chamber window 64 and the susceptor 74 both made of quartz, and impinges upon the back surface of the semiconductor wafer W. The semiconductor wafer W is irradiated with the halogen light from the halogen lamps HL, so that the semiconductor wafer W is preheated to increase the temperature. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the radiation thermometer 20 when the halogen lamps HL perform the preheating. Specifically, the radiation thermometer 20 receives infrared radiation emitted from the lower surface of the semiconductor wafer W held by the susceptor 74 and transmitted through the opening 78 and the transparent window 21, to thereby measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL, based on the value measured with the radiation thermometer 20, so that the temperature of the semiconductor wafer W is equal to the preheating temperature T1. The preheating temperature T1 is in the range of 300 to 600° C., and shall be 450° C. in the present preferred embodiment.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. The halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating. It should be noted that the pressure in the chamber 6 during the preheating is maintained at the pressure P3.

Next, the flash lamps FL in the flash heating part 5 irradiate the front surface of the semiconductor wafer W held by the susceptor 74 with a flash of light at time t6 when a predetermined time period has elapsed since the temperature of the semiconductor wafer W reached the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The front surface of the semiconductor wafer W on which a high dielectric constant film is deposited is irradiated with a flash of light from the flash lamps FL. With this, the temperature of the front surface of the semiconductor wafer W including the high dielectric constant film momentarily increases to a treatment temperature T2 so that PDA is performed. The treatment temperature T2 that is the maximum temperature (peak temperature) reached by the front surface of the semiconductor wafer W subjected to the flash irradiation is in the range of 600 to 1200° C., and shall be 1000° C. in the present preferred embodiment.

When the front surface of the semiconductor wafer W increases up to the treatment temperature T2 so that PDA is performed in ammonia atmosphere, nitridization of the high dielectric constant film is accelerated, and also defects in the high dielectric constant film, such as point defects, are eliminated. It should be noted that light from the flash lamps FL is emitted for a short period of time of approximately 0.1 milliseconds or more and 100 milliseconds or less. Therefore, the time period to increase the temperature of the front surface of the semiconductor wafer W from the preheating temperature T1 to the treatment temperature T2 is also an extremely short time period of less than 1 second. The temperature of the front surface of the semiconductor wafer W after the flash irradiation immediately rapidly decreases from the treatment temperature T2.

At time t7 when a predetermined time period has elapsed since the flash heating treatment finished, the controller 3 closes the valve 84 to reduce the pressure in the chamber 6 again down to the pressure P2. With this, toxic ammonia can be exhausted from the heat treatment space 65 of the chamber 6. Subsequently, at time t8 when the pressure in the chamber 6 reaches the pressure P2, the controller 3 closes the valve 89 and opens the valve 84 such that the treatment gas supply source 85 supplies nitrogen gas as inert gas into the chamber 6 to bring the pressure in the chamber 6 up to the atmospheric pressure Ps. In addition, the halogen lamps HL are also turned off, which causes the temperature of the semiconductor wafer W to decrease from the preheating temperature T1. The radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement. After the atmosphere in the chamber 6 is replaced with nitrogen atmosphere to bring the pressure in the chamber 6 back up to the atmospheric pressure Ps, and the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

In the heat treatment apparatus 1 according to this preferred embodiment, during the time period between the time t1 and the time t2 when the pressure in the chamber 6 is brought to atmospheric pressure and the chamber 6 is filled with an inert gas atmosphere, the atmosphere in the chamber 6 is sucked into the oxygen concentration analyzer 91 such that oxygen concentration in the chamber 6 is measured by the oxygen concentration analyzer 91. Then, after the time t2 when the pressure in the chamber 6 is reduced to less than atmospheric pressure and ammonia as a reactive gas is supplied into the chamber 6, the valve 93 of the sampling line 92 is closed to suspend the measurement of oxygen concentration in the chamber 6. Such configuration is employed because sucking the atmosphere in the chamber 6 is difficult if the pressure in the chamber 6 is reduced to less than atmospheric pressure, and also because the concentration sensor of the oxygen concentration analyzer 91 is unfavorably affected if a reactive gas is supplied into the chamber 6.

In this case, simply closing the valve 93 to suspend the measurement of oxygen concentration in the chamber 6 still keeps the suction pump of the oxygen concentration analyzer 91 working. Thus, a gas having a relatively high oxygen concentration in the gas exhaust pipe 88 as an exhaust line of the chamber 6 may reversely flow into the oxygen concentration analyzer 91 from the gas exhaust pipe 88 through the exhaust pipe 99. There is a fear in that such reverse flow exposes the concentration sensor of the oxygen concentration analyzer 91 to the exhaust from the chamber 6, hindering the measurement of oxygen concentration. Particularly, measurement accuracy in a low oxygen concentration range of 1 ppm or less may be deteriorated.

In view of this, in this preferred embodiment, simultaneously with closing the valve 93 to suspend the measurement of oxygen concentration in the chamber 6, the valve 95 is opened such that nitrogen gas as inert gas is supplied to the oxygen concentration analyzer 91 through the inert gas supply line 94. The nitrogen gas supplied to the oxygen concentration analyzer 91 is exhausted to the gas exhaust pipe 88 through the exhaust pipe 99. With this, even when the measurement of oxygen concentration in the chamber 6 is suspended, reverse flow to the oxygen concentration analyzer 91 from the gas exhaust pipe 88 can be prevented, and the oxygen concentration analyzer 91 can be prevented from being exposed to the exhaust from the chamber 6. The configuration results in maintaining the function of the oxygen concentration analyzer 91, and also maintaining measurement accuracy in a low oxygen concentration range that is particularly important when oxygen concentration is measured in the chamber 6 of this preferred embodiment.

Further, oxygen concentration of the nitrogen gas supplied to the oxygen concentration analyzer 91 through the inert gas supply line 94 is arranged to be lower than oxygen concentration in the chamber 6 when the oxygen concentration is measured. If the oxygen concentration analyzer 91 is exposed to a high oxygen concentration gas during the suspension of the measurement of oxygen concentration in the chamber 6, completely eliminating oxygen out of the oxygen concentration analyzer 91 takes a considerable time, during which time the oxygen concentration analyzer 91 is deprived of the measurement function in the low oxygen concentration range. In this preferred embodiment, the oxygen concentration of the nitrogen gas supplied to the oxygen concentration analyzer 91 through the inert gas supply line 94 is arranged to be lower than the oxygen concentration in the chamber 6. Therefore, the oxygen concentration analyzer 91 maintains the measurement function at least for the oxygen concentration in the chamber 6.

Further, in this preferred embodiment, the pressure-reducing valve 97 and the orifice 96 make the flow rate of inert gas supplied to the oxygen concentration analyzer 91 from the inert gas supply source 98 through the inert gas supply line 94 equal to the flow rate of a gas introduced to the oxygen concentration analyzer 91 from the chamber 6 through the sampling line 92. The concentration sensor of the oxygen concentration analyzer 91 using the zirconia solid electrolyte is heated to a high temperature of approximately 700° C. If the flow rate of the gas flowing into the oxygen concentration analyzer 91 varies, the temperature of the concentration sensor also varies, raising a fear that the oxygen concentration analyzer 91 may be incapable of accurately measuring the concentration. The configuration of making the flow rate of the inert gas supplied to the oxygen concentration analyzer 91 through the inert gas supply line 94 equal to the flow rate of the gas introduced to the oxygen concentration analyzer 91 from the chamber 6 can reduce such variation in the flow rate of the gas flowing into the oxygen concentration analyzer 91, and can also maintain measurement accuracy of the oxygen concentration analyzer 91.

Further, in this preferred embodiment, the sampling line 92 and the inert gas supply line 94 are made of stainless steel. If the sampling line 92 and the inert gas supply line 94 are made of resin, a trace of oxygen may permeate through the resin pipes and flow into the oxygen concentration analyzer 91. If the sampling line 92 and the inert gas supply line 94 are made of stainless steel, such permeation of oxygen through the pipes can be completely blocked to prevent the oxygen concentration analyzer 91 from being exposed to permeating oxygen. Thus, measurement accuracy of the oxygen concentration analyzer 91 in a low oxygen concentration range can be maintained.

Further, in this preferred embodiment, ammonia is started to be supplied into the chamber 6 from the time t4, and ammonia is stopped from being supplied at the time t7. The timer 31 starts to measure time from the time t7 when the supply of ammonia is stopped. The controller 3 does not allow the valve 93 of the sampling line 92 to be opened until the time measured by the timer 31 reaches predetermined setting time (e.g., 2 minutes). In other words, when reactive gas is supplied into the chamber 6, the sampling line 92 is continuously closed for a period of the predetermined setting time since the supply of the reactive gas is stopped. The reactive gas such as ammonia remains inside the chamber 6 for a while after the supply of the reactive gas into the chamber 6 is stopped. However, the remaining reactive gas in the chamber 6 can be prevented from being sucked into the oxygen concentration analyzer 91 by continuously closing the sampling line 92 for the period of the predetermined setting time since the supply of the reactive gas is stopped.

While the preferred embodiment according to the present invention has been described hereinabove, various modifications of the present invention in addition to those described above may be made without departing from the scope and spirit of the invention. For example, in the aforementioned preferred embodiment, the inert gas supply line 94 is provided with the orifice 96. In place of the orifice 96, the inert gas supply line 94 may be provided with a conductance adjustment valve that adjusts conductance of the inert gas supply line 94. Also in this case, the conductance adjustment valve makes an adjustment so that conductance of the inert gas supply line 94 is equal to conductance of the sampling line 92. This configuration makes the flow rate of inert gas supplied to the oxygen concentration analyzer 91 from the inert gas supply source 98 through the inert gas supply line 94 equal to the flow rate of a gas introduced to the oxygen concentration analyzer 91 from the chamber 6 through the sampling line 92. Thus, the same effect as that in the aforementioned preferred embodiment can be obtained.

Further, in the aforementioned preferred embodiment, as an inert gas, nitrogen gas is supplied to the oxygen concentration analyzer 91 through the inert gas supply line 94. However, the inert gas to be supplied is not limited to nitrogen gas, and argon (Ar) or helium (He) may be used as well. It should be noted that, from the viewpoint of preventing increase in costs, nitrogen gas is preferably used as in the aforementioned preferred embodiment.

Further, when reactive gas is still supplied into the chamber 6 although the pressure in the chamber 6 is brought to atmospheric pressure, the valve 93 of the sampling line 92 is closed to suspend measurement of oxygen concentration in the chamber 6, and inert gas is supplied to the oxygen concentration analyzer 91 through the inert gas supply line 94. This is because if the reactive gas flows into the oxygen concentration analyzer 91, the reactive gas may corrode an electrode of the concentration sensor that is heated to a high temperature. In other words, when the pressure in the chamber 6 is reduced to less than atmospheric pressure, or when reactive gas is supplied into the chamber 6, the sampling line 92 is closed to suspend measurement of oxygen concentration in the chamber 6.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

Further, in the aforementioned preferred embodiment, the flash lamps FL and the halogen lamps HL are provided as lamps to irradiate a substrate with light to heat the substrate. Instead, flash lamps and arc lamps as continuous lighting lamps may be provided. Alternatively, only halogen lamps or arc lamps may be provided to perform rapid thermal process (RTP).

Further, the heat treatment apparatus 1 not only processes a substrate of a semiconductor wafer. The heat treatment apparatus 1 may process a glass substrate used for a flat panel display of a liquid crystal display device, and a substrate for a solar cell, for example.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus for irradiating a substrate with light to heat the substrate, comprising:
    a chamber for receiving a substrate therein;
    an exhaust line that exhausts atmosphere in the chamber;
    a lamp for irradiating the substrate received in the chamber with light;
    an oxygen concentration analyzer that sucks atmosphere in the chamber to measure oxygen concentration in the chamber, the oxygen concentration analyzer exhausting a gas sucked from the chamber and used for the measurement of oxygen concentration to the exhaust line;
    a sampling line that connects the chamber and the oxygen concentration analyzer in communication, and introduces atmosphere in the chamber to the oxygen concentration analyzer, the sampling line introducing the atmosphere in the chamber to the oxygen concentration analyzer without going through the exhaust line; and
    an inert gas supply line that supplies inert gas to the oxygen concentration analyzer, wherein
    when the sampling line is closed to suspend the measurement of oxygen concentration in the chamber, inert gas is supplied to the oxygen concentration analyzer through the inert gas supply line.

2. The heat treatment apparatus according to claim 1, wherein
    oxygen concentration of the inert gas supplied through the inert gas supply line is lower than oxygen concentration in the chamber.

3. The heat treatment apparatus according to claim 1, further comprising
    a flow rate adjustment mechanism that makes a flow rate of the inert gas supplied to the oxygen concentration analyzer through the inert gas supply line equal to a flow rate of the gas introduced to the oxygen concentration analyzer from the chamber, the flow rate adjustment mechanism being provided in the inert gas supply line.

4. The heat treatment apparatus according to claim 1, wherein
    the sampling line is made of stainless steel.

5. The heat treatment apparatus according to claim 1, wherein
    when pressure in the chamber is reduced to less than atmospheric pressure, or when reactive gas is supplied into the chamber, the sampling line is closed to suspend the measurement of oxygen concentration in the chamber.

6. The heat treatment apparatus according to claim 5, wherein
    the sampling line is continuously closed for a period of predetermined setting time since the supply of the reactive gas is stopped.

* * * * *